US006999887B2

(12) United States Patent
Rehm et al.

(10) Patent No.: US 6,999,887 B2
(45) Date of Patent: Feb. 14, 2006

(54) MEMORY CELL SIGNAL WINDOW TESTING APPARATUS

(75) Inventors: Norbert Rehm, Kanagawa-ken (JP); Hans-Oliver Joachim, Kanagawa-ken (JP); Michael Jacob, Kanagawa-ken (JP); Joerg Wohlfahrt, Kanagawa-ken (JP)

(73) Assignee: Infineon Technologies AG, Munich (DE)

( * ) Notice: Subject to any disclaimer, the term of this patent is extended or adjusted under 35 U.S.C. 154(b) by 77 days.

(21) Appl. No.: 10/636,369

(22) Filed: Aug. 6, 2003

(65) Prior Publication Data

US 2005/0033541 A1 Feb. 10, 2005

(51) Int. Cl.
*G06F 3/06* (2006.01)

(52) U.S. Cl. ................ 702/117; 702/116; 702/119; 702/120

(58) Field of Classification Search .......... 702/89, 702/91, 116–120, 176, 183, 189; 365/145; 704/500; 711/5, 144, 167; 714/718
See application file for complete search history.

(56) References Cited

U.S. PATENT DOCUMENTS

| 6,065,092 A | * | 5/2000 | Roy | 711/5 |
| 6,119,251 A | * | 9/2000 | Cloud et al. | 714/718 |
| 6,282,135 B1 | * | 8/2001 | Proebsting | 365/203 |
| 6,675,272 B2 | * | 1/2004 | Ware et al. | 711/167 |
| 6,920,540 B2 | * | 7/2005 | Hampel et al. | 711/167 |
| 2004/0143710 A1 | * | 7/2004 | Walmsley | 711/144 |

* cited by examiner

*Primary Examiner*—Marc S. Hoff
*Assistant Examiner*—Felix Suarez
(74) *Attorney, Agent, or Firm*—Fish & Richardson P.C.

(57) ABSTRACT

A memory cell signal window testing apparatus 101 and method for testing the signal window of a memory are disclosed. First data is written to a memory cell during a write cycle. A low cell signal is read from the memory cell during a first read cycle. A comparison is made between the low signal and a low reference signal. The result of the comparison is stored in a first storage register. Second data is then written to the memory cell during a write cycle. A high cell signal is read from the memory cell during a second read cycle. A comparison is made between the high cell signal and a high reference signal. The result of the comparison is stored in a second storage register. The results in the first and second storage registers are compared and an output is provided indicating that the memory cell has failed the test if the comparison shows that both the low cell signal is higher than the low reference signal and the high cell signal is lower than the high reference signal.

6 Claims, 3 Drawing Sheets

MEMORY CELL SIGNAL WINDOW TESTING APPARATUS

FIELD OF THE INVENTION

The present invention relates to the testing of the signal window of memory cells.

BACKGROUND OF THE INVENTION

The signal window for a 1T1C FeRAM memory cell is tested using a low reference voltage (Signal Distribution reference voltage low—"SD Vref low") and a high reference voltage (Signal Distribution reference voltage high—"SD Vref high") and running some write/read patterns. FIG. 1 shows a signal distribution of an FeRAM memory chip and some typical low/high reference voltages for testing (SD Vref high/low). The signal window of an FeRAM memory cell is the difference of the high signal and the low signal of the cell. The minimum signal window for each cell which can be guaranteed by this prior-art test method is the difference between "SD Vref high" and "SD Vref low".

As shown in FIG. 2, the signal window distribution can show a main distribution which is much higher than the tested minimum signal window. The cells with a signal window higher than the tested window but lower than the main distribution are most likely to fail during the lifetime of the chip. The easiest method to find these cells would be to increase the range of the high/low reference voltage (SD Vref high/low). But this method would lead to a dramatic increase in failcount and thus to a dramatic decrease in yield because even cells having a very good signal window would fail if one of their signals is at the wrong position in the distribution. This method only checks if the low signal of all cells is below some certain reference and the high signal of all cells is above a certain reference voltage.

To find only cells with a small signal window, a test is needed which finds only cells which have a low signal higher than "SW Vref low" ("SW" stands for "Signal Window") AND a high signal of the same cell which is lower than "SW Vref high".

In high parallel testing of memory chips the failures are usually compressed to the smallest redundancy and therefore the information about which cell of a certain group of cells was failing the test is lost. The only information available is that at least one cell of the certain group was failing the test. Due to this compression, it is not possible to test for single Cells which are failing both test 1 AND test 2.

For redundancy repair, a certain signal margin has to be applied to find the weak cells in an FeRAM memory. This criteria leads, however, to a certain yield loss, and in the worst case to chips which are sorted out even though they could have been repaired and used. It would be desirable to be able to find weak cells which need repair, without unnecessary yield loss.

It would be desirable to have a signal window test mode for memory cells which is able to find single cells having small signal windows.

SUMMARY OF THE INVENTION

The test mode of the present invention provides testing of FeRAM memory for a required signal window for each individual cell even with high parallel testing and with failure compression. Weak cells in FeRAM memories can be identified and repaired with minimum product yield loss.

A memory cell signal window testing apparatus 101 and method for testing the signal window of a memory are disclosed. First data is written to a memory cell during a write cycle. A low cell signal is read from the memory cell during a first read cycle. A comparison is made between the low signal and a low reference signal. The result of the comparison is stored in a first storage register. Second data is then written to the memory cell during a write cycle. A high cell signal is read from the memory cell during a second read cycle. A comparison is made between the high cell signal and a high reference signal. The result of the comparison is stored in a second storage register. The results in the first and second storage registers are compared and an output is provided indicating that the memory cell has failed the test if the comparison shows that both the low cell signal is higher than the low reference signal and the high cell signal is lower than the high reference signal.

BRIEF DESCRIPTION OF THE FIGURES

Further preferred features of the invention will now be described for the sake of example only with reference to the following figures, in which.

DETAILED DESCRIPTION OF THE EMBODIMENTS

Figure 1:
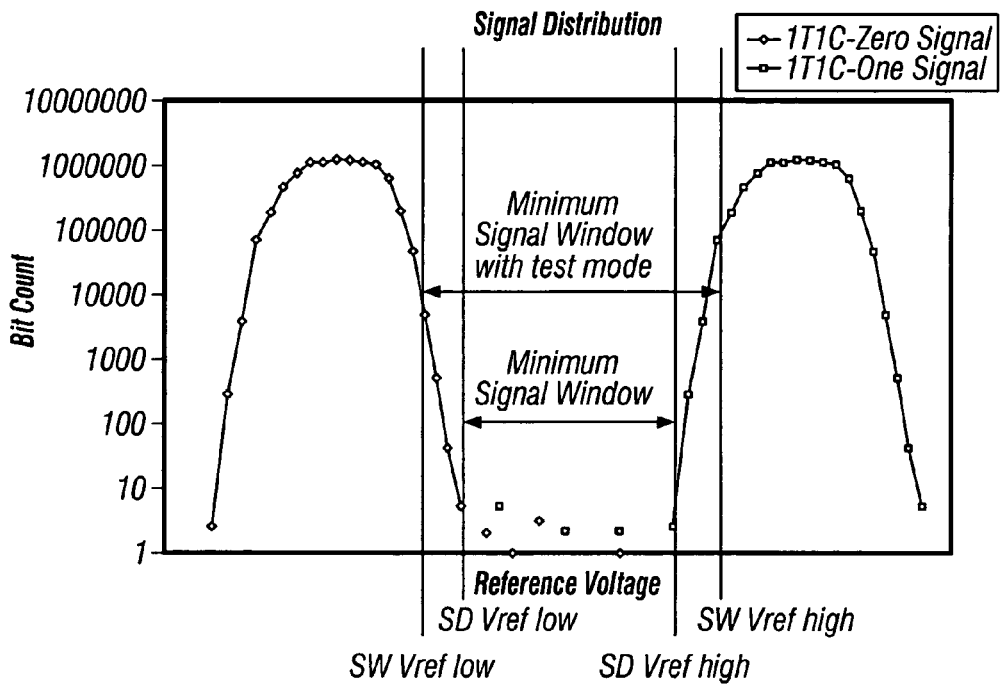
FIG. 1 shows a prior-art signal distribution of an FeRAM memory chip and some typical low/high reference voltages for testing.
Figure 2:
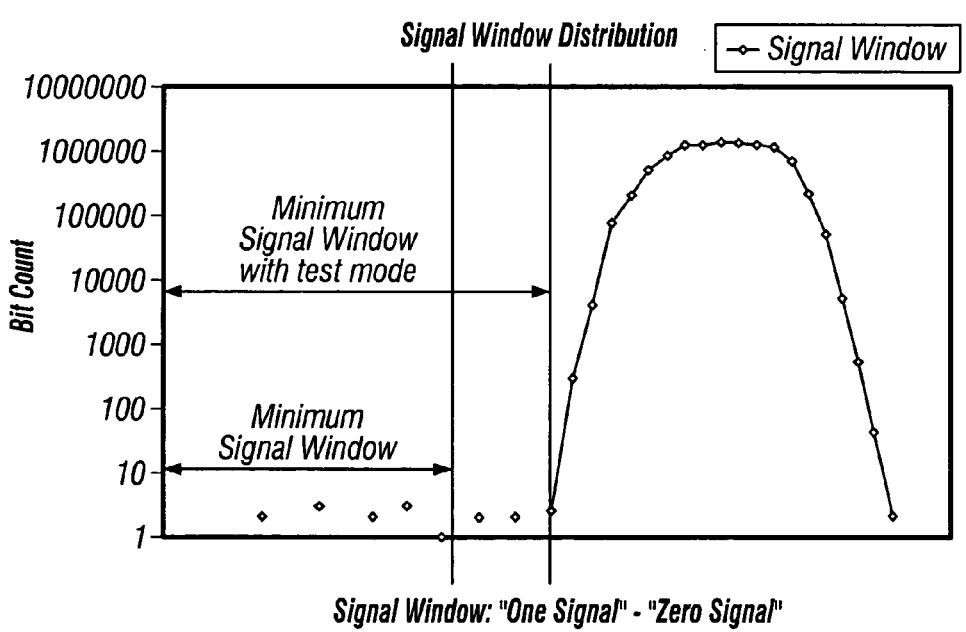
FIG. 2 illustrates a prior-art signal window distribution having a main distribution which is much higher than the tested minimum signal window.
Figure 3:
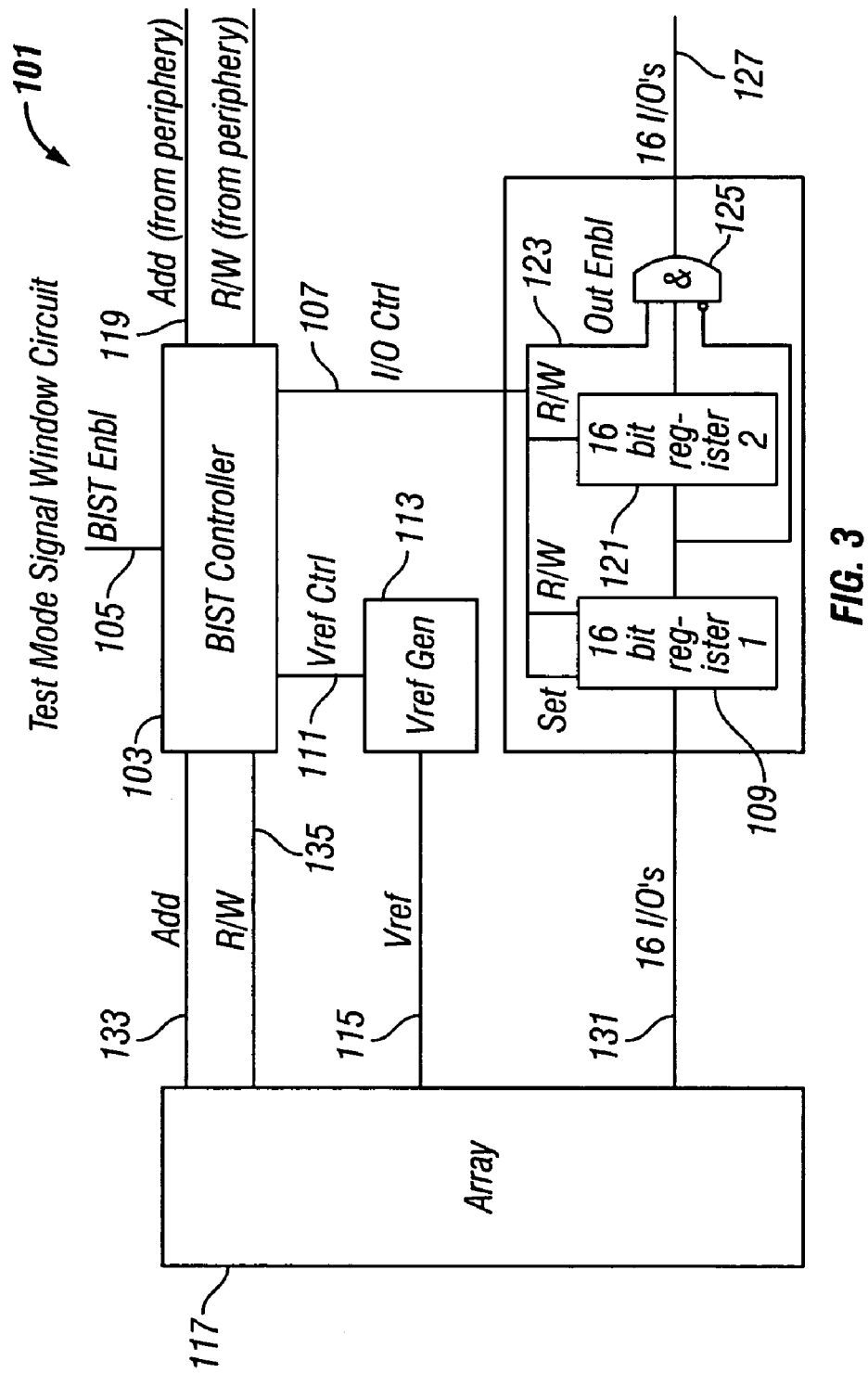
FIG. 3 shows the configuration for the signal window test mode of the present invention.
Figure 4:
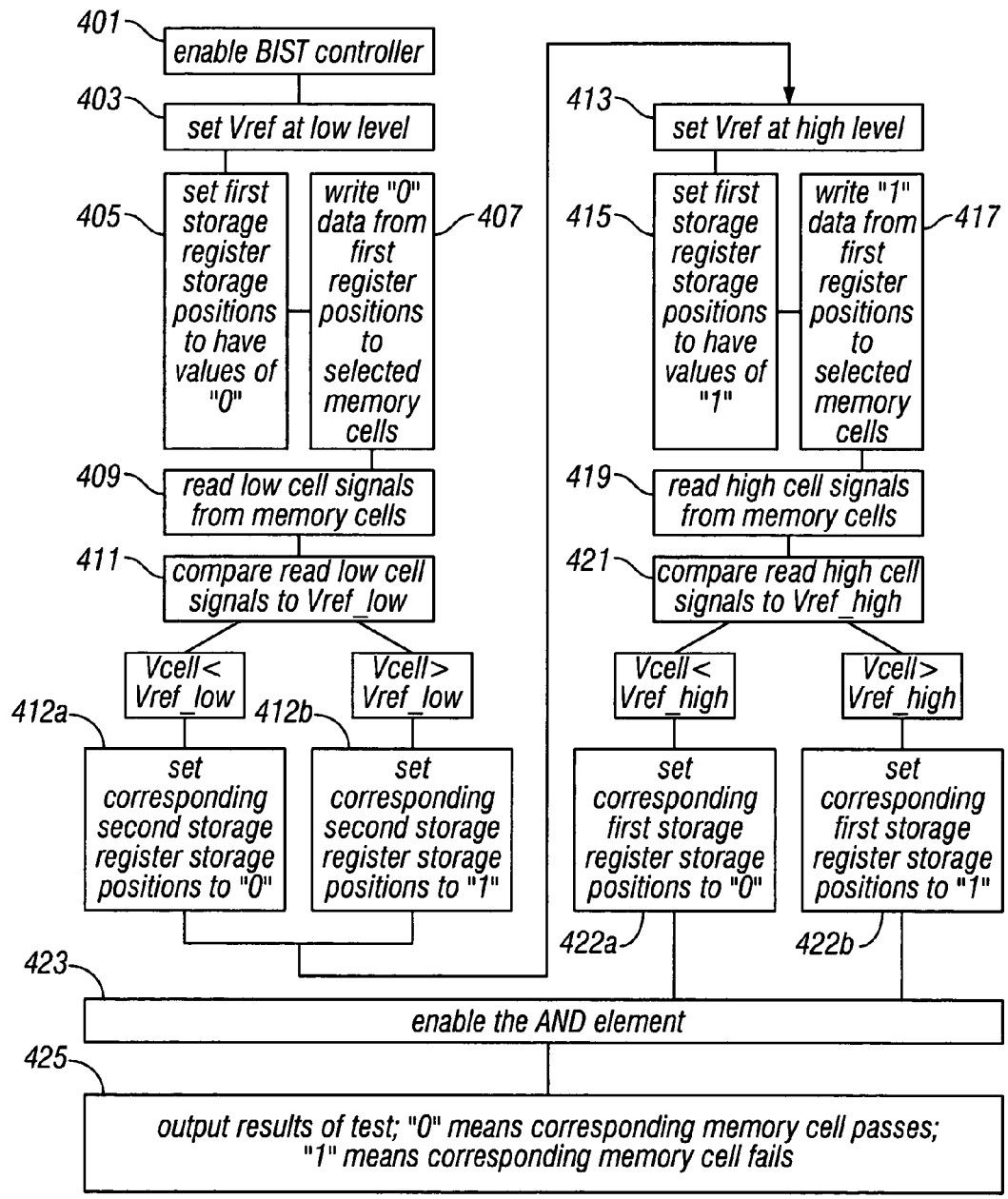
FIG. 4 is a flowchart showing the method of the present invention.

A memory cell signal window testing apparatus 101 and method for testing the signal window of a memory are described with respect to FIGS. 3 and 4. The apparatus 101 can be on a memory chip as a test mode. At step 401 a BIST (Built In Self Test) controller 103 is enabled in response to receiving a signal input into a BIST Enable input 105.

At step 403 the BIST controller 103 sends a signal through a Vref Control (voltage reference control) input 111 to set a Vref Generator (reference voltage generator) 113 to output a SW Vref_low signal (signal window low reference voltage signal) through the Vref output 115. The Vref is supplied to an array of memory cells 117 being tested.

At step 405 the BIST controller 103 sets the storage positions of a first storage register 109 to "0" (zero). The first storage register 109 can store 16 bits, for example.

At step 407 the "0" data in the first storage register 109 is written through an I/O (Input Output) control 131 to memory cells of the array of memory cells 117 being tested. The I/O control 131 can, for example, supply 16 channels of data from a 16 bit first register 109, for example. The "0" data is only written to the memory cells selected by an input to an external address input 119 and input to the array 117 through an input 133.

At step 409 a read cycle is performed and read low cell signals (signals output from the memory cells storing the "0" data) are obtained from the memory cells which received the "0" data from the first storage register 109 during the previous step 407. A read/write (R/W) line 135 provides the read and write commands for the storage registers 109, 121.

A comparison is performed at step 411 by a sense amplifier of the memory chip on which the apparatus 101 is implemented. The cell signal is on one input to the sense amplifier and the reference signal is on the other input. The read low cell signals are compared with the SW Vref_low signal provided through the input 115. For the memory cells outputting low cell signals less than the Vref_low signal, the corresponding positions in the second register 121 is set to "0" at step 412a. For the memory cells outputting low cell signals greater than the Vref_low signal, the corresponding positions in the second register are set to "1" at step 412b. The second register 121, like the first register 109, can store 16 bits.

At step 413 the BIST controller 103 sends a signal through the Vref Control input 111 to set the Vref Generator 113 to output a SW Vref_high signal (signal window high reference voltage signal) through the Vref output 115. The Vref is supplied to the array of memory cells 117 being tested.

At step 415 the BIST controller 103 sets the storage positions of the first storage register 109 to "1".

At step 417 the "1" data in the first storage register 109 is written through an I/O (Input Output) control 131 to memory cells of the array of memory cells 117 being tested. The "1" data is written to the same memory cells that were set to "0" in the step 407.

At step 419 a read cycle is performed and read high cell signals (signals output from the memory cells storing the "1" data) are obtained from the memory cells which received the "1" data from the first storage register 109 during the previous step 417.

A comparison is performed by the sense amplifier at step 421. The read high cell signals are compared with the SW Vref_high signal provided through the input 115. For the memory cells outputting high cell signals less than the Vref_high signal, the corresponding positions in the first register ar set to "0" at step 422a. For the memory cells outputting high cell signals higher than the Vref_high signal, the corresponding positions in the first register 109 are set to "1" at step 422b.

Thus the first register 109 has the pass/fail data for the case when the memory cells are supplied with the "1" data and the second register 121 has the pass/fail data for the case when the memory cells are supplied with the "0" data.

For the case of the "1" data, for every failed memory cell there is a corresponding "0" in a corresponding position of the first register 109. For the case of the "0" data, for every failed memory cell there is a corresponding "1," in a corresponding position of the second register 121.

At step 423 an out enable signal from an input 123 supplied through the line 107 enables the AND element 125. The AND element 125 performs an AND operation on the positions of the first register 109 and second register 121. It produces a "1" at an output 127 for every I/O where the second register 121 is "1" AND the first register 109 is "0".

At step 425 the pass/fail data is obtained from the AND element 125 outputs 127. "0" outputs from the output 127 indicate that the corresponding memory cell has passed the signal window test while "1" outputs from the outputs 127 indicate that the corresponding memory cell has failed.

Above it is assumed that memory cells are used which have a low signal when "0" is written to them and have a high signal when "1" is written to them. For addresses not following this assumption, the BIST controller can take this into account and can adopt the data accordingly. The BIST controller examines an externally applied address and decides how the data must be written and read (e.g. on BL and /BL the data should be different in order for the test mode circuit to work properly).

The present invention can be used to test memory cells in the 1T1C configuration. It can also be used to test memory cells in the 2T2C configuration as long as they have an option to operate in the 1T1C configuration.

Still other components and method steps can be added or substituted for those above. Thus, although the invention has been described above using particular embodiments, many variations are possible within the scope of the claims, as will be clear to a skilled reader.

We claim:

1. A method for testing the signal window of a memory cell comprising the steps of:
    writing first data to a memory cell during a write cycle;
    reading a low cell signal from the memory cell during a first read cycle;
    comparing the low cell signal to a low reference signal;
    storing the result of the comparison in a first storage register;
    writing second data to a memory cell during a write cycle;
    reading a high cell signal from the memory cell during a second read cycle;
    comparing the high cell signal to a high reference signal;
    storing the result of the comparison in a second storage register; and
    comparing the results in the first and second storage registers and outputting an indication that the memory cell has failed the test if the comparison shows that both the low cell signal is higher than the low reference signal and the high cell signal is lower than the high reference signal.

2. The method of claim 1, wherein the first data is "0" and the second data is "1".

3. The method of claim 1, wherein the memory cell is one of an array of memory cells receiving the first and second data and outputting separate low and high cell signals for comparison with the low and high reference signals.

4. A memory cell signal window testing apparatus comprising:
    means for writing first data to a memory cell during a write cycle;
    means for reading a low cell signal from the memory cell during a first read cycle;
    means for comparing the low cell signal to a low reference signal;
    means for storing the result of the comparison in a first storage register;
    means for writing second data to a memory cell during a write cycle;
    means for reading a high cell signal from the memory cell during a second read cycle;
    means for comparing the high cell signal to a high reference signal;
    means for storing the result of the comparison in a second storage register; and
    means for comparing the results in the low and high storage registers and outputting an indication that the memory cell has failed the test if the comparison shows that both the low cell signal is higher than the low reference signal and the high cell signal is higher than the second reference signal.

5. The apparatus of claim 4, wherein the first data is "0" and the second data is "1".

6. The apparatus of claim 4, wherein the memory cell is one of an array of memory cells receiving the first and second data and outputting separate low and high cell signals for comparison with the low and high reference signals.

* * * * *